US012306221B2

United States Patent
Chen et al.

(10) Patent No.: US 12,306,221 B2
(45) Date of Patent: May 20, 2025

(54) INDICATOR LIGHT CIRCUIT CONFIGURED FOR MICRO-CURRENT AND MICRO-CURRENT SHOWER HEAD

(71) Applicant: Xiamen Solex High-Tech Industries Co., Ltd., Fujian (CN)

(72) Inventors: Boren Chen, Fujian (CN); Shuangjiu Wang, Fujian (CN); Jianan Li, Fujian (CN); Lian Zhang, Fujian (CN)

(73) Assignee: Xiamen Solex High-Tech Industries Co., Ltd., Fujian (CN)

( * ) Notice: Subject to any disclaimer, the term of this patent is extended or adjusted under 35 U.S.C. 154(b) by 114 days.

(21) Appl. No.: 18/112,710

(22) Filed: Feb. 22, 2023

(65) Prior Publication Data
US 2023/0280380 A1 Sep. 7, 2023

(30) Foreign Application Priority Data
Mar. 1, 2022 (CN) .......................... 202210197520.0

(51) Int. Cl.
*G01R 19/25* (2006.01)
*B05B 1/18* (2006.01)
*G01R 1/30* (2006.01)

(52) U.S. Cl.
CPC ............... *G01R 19/25* (2013.01); *B05B 1/18* (2013.01); *G01R 1/30* (2013.01)

(58) Field of Classification Search
CPC ...... G01R 19/25; G01R 19/30; G01R 19/165; G05F 1/46; G05F 1/56; G05B 19/05; H02M 3/1582; H02M 3/158; H02M 1/08; H02M 1/0045; A61N 1/3603; A61N 1/3228
See application file for complete search history.

(56) References Cited

U.S. PATENT DOCUMENTS

| 2013/0187572 A1* | 7/2013 | Grajcar | .................. H05B 45/44 |
| | | | 315/312 |
| 2019/0184410 A1* | 6/2019 | Luo | .......................... A61N 1/44 |

FOREIGN PATENT DOCUMENTS

| CN | 200945467 Y | * | 9/2007 |
| DE | 202017107242 U1 | * | 1/2018 |
| JP | 636567 U | | 5/1994 |

OTHER PUBLICATIONS

Decision to Grant cited in JP Application No. 2022-205881, mailed Oct. 3, 2024, 5 pages.
Office Action cited in JP Application No. 2022-205881, mailed Jun. 5, 2024, 12 pages.
Office Action cited in JP Application No. 2022-205881, mailed Feb. 15, 2024, 10 pages.

* cited by examiner

*Primary Examiner* — Lee E Rodak
*Assistant Examiner* — Demetrius R Pretlow
(74) *Attorney, Agent, or Firm* — Cooper Legal Group, LLC

(57) ABSTRACT

An indicator light circuit configured for a micro-current comprises an indicator light module, a logic controller, and a sampling circuit. The logic controller is configured to compare a sample voltage generated by the micro-current on the sampling circuit with a first preset threshold voltage. When the sample voltage is greater than the first preset threshold voltage, the logic controller outputs a control signal to the indicator light module to drive an indicator light of the indicator light module to be turned on.

16 Claims, 5 Drawing Sheets

INDICATOR LIGHT CIRCUIT CONFIGURED FOR MICRO-CURRENT AND MICRO-CURRENT SHOWER HEAD

RELATED APPLICATIONS

This application claims priority to Chinese patent application number 202210197520.0, filed on Mar. 1, 2022. Chinese patent application number 202210197520.0 is incorporated herein by reference.

FIELD OF THE DISCLOSURE

The present disclosure relates to an indicator light circuit, and in particular to an indicator light circuit configured for a micro-current.

BACKGROUND OF THE DISCLOSURE

In order to improve a texture of skin, many types of beauty instruments are available on the market. The beauty instrument is usually driven by an external power supply, such as a battery, to drive a body to move, so as to massage skin and achieve a beauty effect.

However, the existing beauty instruments need an external power supply to work (i.e., the beauty instrument needs to be provided with the external power supply to operate). Therefore, most beauty instruments are used in an environment away from water. Even if the beauty instrument is driven by a battery with additional water-tight structures, there is still a risk of water ingress, and therefore the beauty instrument is only allowed to operate in environments with a small amount of water, and there is a large degree of safety risk if used while showering.

In order to solve the problem, a micro-current shower head appears on the market, and a human body is used as a conductor, so that a micro-current stimulates and massages the skin of the human body through the human body, and the beauty effect is achieved. In the existing techniques, a microampere-level current is called a micro-current. However, the micro-current is not as small as possible, and the micro-current has to reach a certain value to work. The micro-current shower head in the existing techniques only simply connect a human body between a positive electrode and a negative electrode of a power supply, so that a situation where the micro-current is insufficient is likely to occur, and the beauty effect is not achieved. Moreover, when the user uses the micro-current shower head, the user does not know whether the micro-current reaches an effective value, and an indicating light on the micro-current shower head can be turned on as long as the micro-current exists, so the user is easily misled.

BRIEF SUMMARY OF THE DISCLOSURE

The present disclosure provides an indicator light circuit configured for a micro-current which can indicate whether the micro-current reaches an effective value.

In order to solve the technical problem, the present disclosure provides an indicator light circuit configured for a micro-current comprising an indicator light module, a logic controller, and a sampling circuit. The logic controller is configured to compare a sample voltage generated by the micro-current on the sampling circuit with a first preset threshold voltage. When the sample voltage is greater than the first preset threshold voltage, the logic controller outputs a control signal to the indicator light module to drive an indicator light of the indicator light module to be turned on.

In a preferred embodiment, an output terminal of the logic controller is connected to the indicator light module.

In a preferred embodiment, the indicator light circuit configured for the micro-current further comprises an external terminal. The external terminal comprises a first terminal connected to an output voltage and a second terminal connected to a sampling resistor, and the micro-current is generated when the first terminal and the second terminal are conductively connected together through an external conductive medium.

In a preferred embodiment, the indicator light circuit configured for the micro-current further comprises a rectification module and a voltage boosting module. An input terminal of the voltage boosting module is connected to a utility power, an output terminal of the rectification module is connected to the input terminal of the voltage boosting module, and the output terminal of the logic controller is connected to an output terminal of the voltage boosting module. When the sample voltage is less than the first preset threshold voltage, the logic controller drives the voltage boosting module to boost the output voltage until the sample voltage is equal to or greater than the first preset threshold voltage.

In a preferred embodiment, the indicator light circuit configured for the micro-current further comprises a resistance access detection module. The resistance access detection module is configured to compare the sample voltage with a second preset threshold voltage to judge whether the first terminal and the second terminal are electrically connected together through the external conductive medium.

In a preferred embodiment, the logic controller comprises a first comparator, the resistance access detection module comprises a second comparator, and each of an output terminal of the first comparator and an output terminal of the second comparator is connected to an OR gate.

In a preferred embodiment, the indicator light circuit configured for the micro-current comprises an upper bound voltage detection module. The upper bound voltage detection module is configured to compare the output voltage with a third preset threshold voltage to judge whether the output voltage reaches an upper bound voltage.

In a preferred embodiment, the upper bound voltage detection module comprises a third comparator, and an output terminal of the third comparator is connected to the OR gate.

In a preferred embodiment, the logic controller is a single chip microcomputer, an input terminal of the single chip microcomputer is connected to the sample voltage, and an output terminal of the single chip microcomputer is connected to the voltage boosting module.

In a preferred embodiment, the input terminal of the single chip microcomputer is connected to the output voltage and is configured to compare the output voltage with a third preset threshold voltage to judge whether the output voltage reaches an upper bound voltage.

The present disclosure provides a micro-current shower head comprising a shower head body and an indicator light circuit configured for a micro-current disposed on the shower head body. The indicator light circuit comprises an indicator light module disposed on the shower head body, and the indicator light circuit comprises a logic controller and a sampling circuit. The sampling circuit is connected to an input terminal of the logic controller, and the logic controller is operatively connected to the indicator light module. The logic controller is configured to compare a sample voltage generated by the micro-current on the sampling circuit with a first preset threshold voltage, and when the sample voltage is greater than the first preset threshold voltage, the logic controller outputs a control signal to the indicator light module to drive an indicator light of the indicator light module to be turned on.

In a preferred embodiment, the indicator light circuit is the indicator light circuit above-mentioned.

Compared with the existing techniques, the technical solution has the following advantages.

1. The present disclosure provides the indicator light circuit configured for the micro-current. The indicator light can be turned on only when the micro-current reaches a constant current state, so that a user can clearly know that the micro-current acting on a human body is an effective micro-current.

2. The present disclosure provides the indicator light circuit configured for the micro-current. A sampling resistor is provided, and the sample voltage of the sampling resistor is obtained through the logic controller. Whether a micro-current value is in an effective current value range is judged through a comparison between the sample voltage and a threshold voltage. When the micro-current value is not in the effective current value range, an output voltage is adjusted, and the micro-current is always output in the effective current value range.

DETAILED DESCRIPTION OF THE EMBODIMENTS

Figure 1:
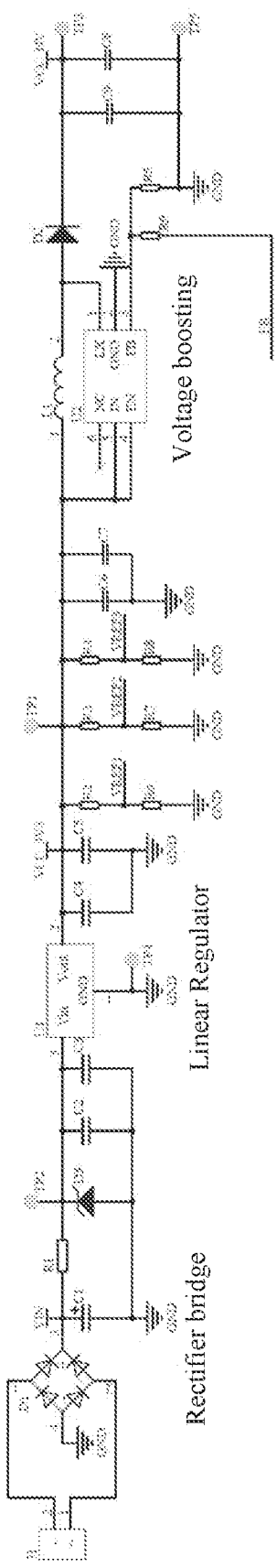
FIG. 1 illustrates a circuit diagram of a voltage boosting part of an indicator light circuit configured for a micro-current in Embodiment 1 of the present disclosure.

The present disclosure will be further described below in combination with the accompanying drawings and embodiments.

The following will clearly and completely describe the technical solutions in the embodiments of the present disclosure with reference to the accompanying drawings. Obviously, the described embodiments are only a portion of the embodiments of the present disclosure, and not all of the embodiments. Based on the embodiments of the present disclosure, all other embodiments obtained by those of ordinary skill in the art without creative work fall within the protection scope of the present disclosure.

In the description of the present disclosure, it should be noted that the terms "upper", "lower", "inner", "outer", "top/bottom", etc. indicate the orientation or positional relationship based on the orientation shown in the drawings. The positional relationship is only for the convenience of describing the present disclosure and simplifying the description, rather than indicating or implying that the pointed device or element must have a specific orientation, be constructed, and be operated in a specific orientation. Therefore, the positional relationship should not be understood as a limitation of the present disclosure. In addition, the terms "first" and "second" are only used for descriptive purposes and should not be understood as indicating or implying relative importance.

In the description of the present disclosure, it should be noted that the terms "installed", "provided with", "sleeved/connected", "connected", etc., should be understood broadly. For example, "connected" can be a fixed connection, a detachable connection, or an integral connection, a mechanical connection, an electrical connection, a direct connection, or an indirect connection through an intermediate medium, and it can be a connection between two members. For those of ordinary skill in the art, the specific meaning of the above terms in the present disclosure can be understood under specific conditions.

Embodiment 1

Figure 2:
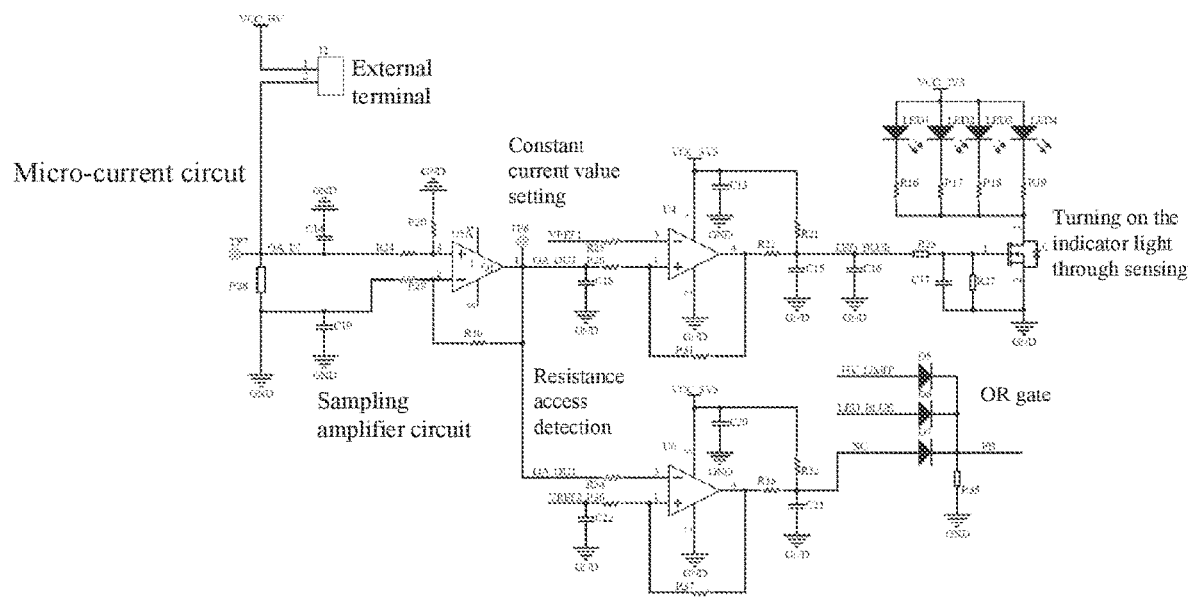
FIG. 2 illustrates a circuit diagram of a detection part of the indicator light circuit in Embodiment 1 of the present disclosure.
Figure 3:
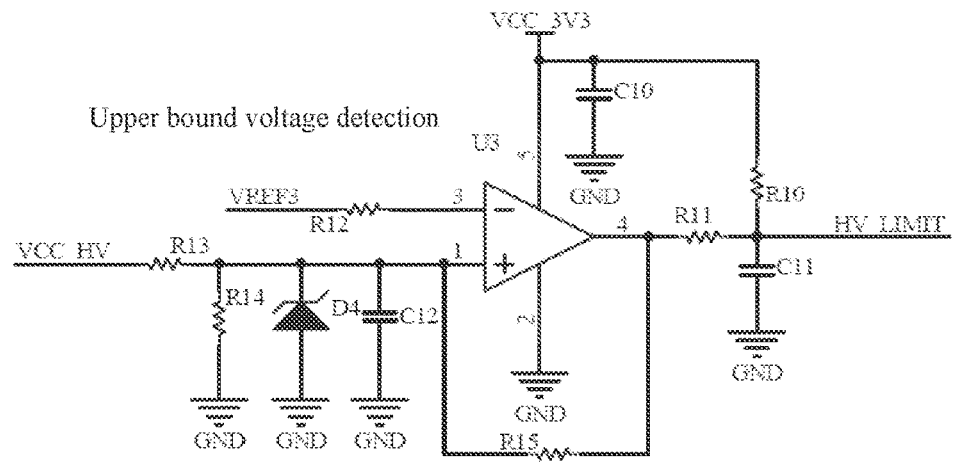
FIG. 3 illustrates a circuit diagram of an upper bound voltage detection part of the indicator light circuit in Embodiment 1 of the present disclosure.

Referring to FIGS. 1 to 3, the present disclosure provides an indicator light circuit configured for a micro-current, and the indicator light circuit comprises a rectification module, a voltage boosting module U2, a logic controller, and an indicator light module.

An input terminal of the rectification module is connected to a utility power, an output terminal of the rectification module is connected to an input terminal of the voltage boosting module U2, and an output terminal of the logic controller is connected to an output terminal of the boosting module U2. The logic controller is configured to compare a sample voltage generated by the micro-current on a sampling circuit with a first preset threshold voltage VREF1, and when the sample voltage reaches the first preset threshold voltage VREF1, a current value of the micro-current can be considered to have reached an effective value. In this embodiment, the sampling circuit is specifically a sampling resistor R28. The logic controller is configured to output a control signal to a switch tube Q1 to drive the switch tube Q1 to be turned on, so as to enable an indicator light to be turned on. Therefore, a user can know that the current value of the micro-current has reached the effective value.

In this embodiment, in order to automatically increase the current value of the micro-current before the current value of the micro-current reaches the effective value, the voltage boosting module U2 is provided. When the sample voltage is less than the first preset threshold voltage VREF1, the logic controller drives the voltage boosting module U2 to boost an output voltage VCC HV until the sample voltage is equal to or greater than the first preset threshold voltage VREF 1. Therefore, the current value of the micro-current can be increased through increasing the output voltage VCC HV.

In order to realize the micro-current, the present embodiment further provides an external terminal J2. The external terminal J2 has a first terminal connected to the output voltage VCC HV and a second terminal connected to the sampling resistor R28, and the micro-current is generated when the first terminal and the second terminal are conductively connected together through an external conductive medium.

In this embodiment, in order to better compare the sample voltage with the first preset threshold voltage VREF1, the logic controller comprises an operational amplifier U5A and a first comparator U4. A non-inverting input terminal + of the operational amplifier U5A is connected to one end of the sampling resistor R28 through a resistor R24, and an inverting input terminal − of the operational amplifier U5A is connected to the other end of the sampling resistor R28 through a resistor R29. When the micro current passes through the sampling resistor R28, a voltage on the sampling resistor R28 is OA_IN. The OA_IN is amplified to OA_OUT through the operational amplifier U5A, and an amplification factor is R30/R29, so that the sample voltage is obtained.

An output terminal of the operational amplifier U5A is connected to a non-inverting input terminal + of the first comparator U4, and an inverting input terminal − of the first comparator U4 is connected to the first preset threshold voltage VREF 1.

The embodiment further provides a resistance access detection module, and the resistance access detection module is configured to compare the sample voltage with a second preset threshold voltage VREF2 to judge whether the first terminal and the second terminal are electrically connected together through the external conductive medium.

Specifically, the resistance access detection module comprises a second comparator U6. An inverting input terminal − of the second comparator U6 is connected to the sample voltage, and a non-inverting input terminal + of the second comparator U6 is connected to the second preset threshold voltage VREF 2. An output terminal of the first comparator U4 and an output terminal of the second comparator U6 are respectively connected to an OR gate.

The embodiment further provides an upper bound voltage detection module. The upper bound voltage detection module is configured to compare the output voltage VCC HV with a third preset threshold voltage VREF3 to judge whether the output voltage VCC HV reaches an upper bound voltage. Specifically, the upper bound voltage detection module comprises a third comparator U3, and an output terminal of the third comparator U3 is connected to the OR gate.

When working, the following situations are presented.

1) when a human body resistor (i.e., a human body) is not connected, the first preset threshold voltage VREF1>OA_OUT, and the second preset threshold voltage VREF2>OA_OUT, so that the first comparator U4 outputs a low level signal and the second comparator U6 outputs a high level signal to enable the OR gate to output a high level signal VFB. At this time, the voltage boosting module U2 does not boost the output voltage VCC HV.

2) when the human body resistor is connected (i.e., the resistance is increased), the first preset threshold voltage VREF1>OA_OUT, and the second preset threshold voltage VREF2<OA_OUT, so that the first comparator U4 and the second comparator U6 respectively output a low level signal to enable the OR gate to output a low level signal. At this time, the voltage boosting module U2 continuously boosts the output voltage VCC HV to enable the micro-current in a micro-current circuit to be continuously increased.

3) when the micro-current in the human body resistor reaches the effective value, the first preset threshold voltage VREF1<OA_OUT, and the second preset threshold voltage VREF2<OA_OUT, so that the first comparator U4 outputs a high level signal and the second comparator U6 outputs a low level signal to enable the OR gate to output the high level signal VFB. At this time, the voltage boosting module U2 does not boost the output voltage VCC HV, and the micro-current circuit keeps outputting the micro-current with the effective value.

4) when the human body resistor is wet or the like (i.e., the resistance is reduced), the first preset threshold voltage VREF1<OA_OUT, and the second preset threshold voltage VREF2<OA_OUT, so that the first comparator U4 outputs a high level signal and the second comparator U6 outputs a low level signal to enable the OR gate to output the high level signal VFB. At this time, the boosting module U2 does not boost the output voltage VCC HV, the output voltage VCC HV slowly falls until the first preset threshold voltage VREF1>OA_OUT and the second preset threshold voltage VREF2<OA_OUT, and the circuit returns to the situation 2) to continue working.

5) when the human body resistor changes again, the circuit keeps cycling among the situation 2), the situation 3), and the situation 4) until the human body resistor leaves, and then the circuit returns to the situation 1).

6) when the output voltage VCC HV is greater than the third preset threshold voltage VREF3, VCC HV*R14/(R13+R14)>VREF3, and the third comparator outputs a high-level signal HV_LIMIT. The OR gate outputs the high signal VFB, and the voltage boosting module U2 does not boost the output voltage VCC HV.

7) When the output voltage VCC HV is less than the third preset threshold voltage VREF3, the third comparator outputs a low level signal HV_LIMIT.

8) When the current value of the micro-current in the micro-current circuit reaches the effective value set by the user, OA_OUT>VREF1, the first comparator U4 outputs a high level signal to the switch tube Q1 of the indicator light module, the switch tube Q1 is controlled to be turned on, and the indicator light is turned on.

9) When the current value of the micro-current in the micro-current circuit does not reach the effective value set by the user, OA_OUT<VREF1, the first comparator U4 outputs a low level signal to the switch tube Q1 of the indicator light module, the switch tube Q1 is controlled to be turned off, and the indicator light is turned off.

It should be noted that, for the human body, a safe current is below 10 mA, and the effective value is set to be only 50-1000 μA, so the micro-current output to the human body is very safe.

Embodiment 2

Figure 4:
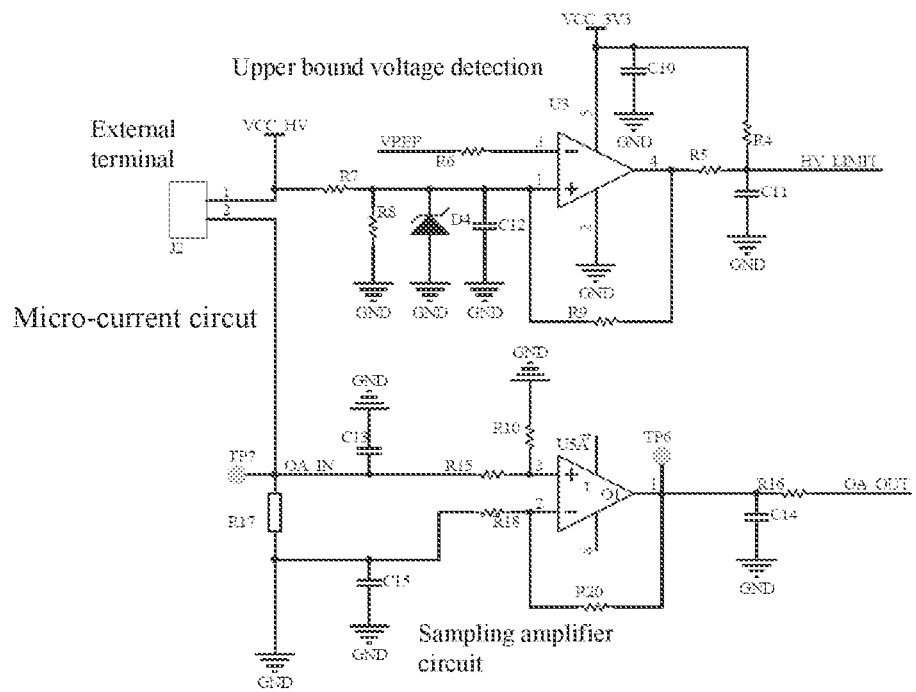
FIG. 4 illustrates a circuit diagram of a detection part of an indicator light circuit in Embodiment 2 of the present disclosure.
Figure 5:
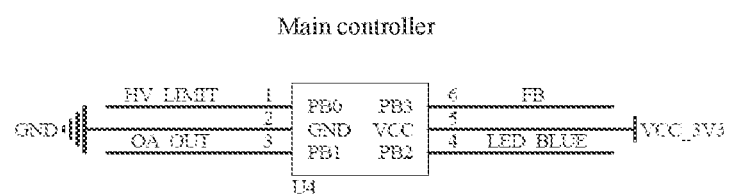
FIG. 5 illustrates a circuit diagram of a single chip microcomputer part in Embodiment 2 of the present disclosure.
Figure 6:
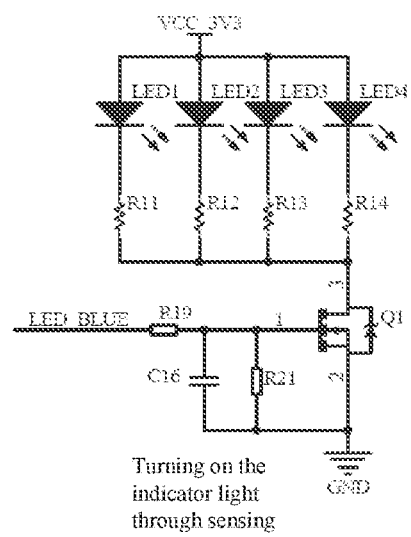
FIG. 6 illustrates a circuit diagram of an indicator light part in Embodiment 2 of the present disclosure.

Referring to FIGS. 4-6, Embodiment 1 achieves comparison between the sample voltage and a preset threshold voltage by comparators and belongs to a pure hardware mode. A sampling software mode of Embodiment 2 is provided to achieve the above-mentioned function, and specifically, the logic controller is a single chip microcomputer U4. An input terminal of the single chip microcomputer U4 is connected to the sample voltage, and an output terminal of the single chip microcomputer U4 is connected to the voltage boosting module U2. The effect of Embodiment 1 can also be achieved by comparing an ADC (Analog-to-Digital Converter) value of the sample voltage read by the single chip microcomputer U4 with a preset threshold voltage.

Meanwhile, the input terminal of the single chip microcomputer U4 is also connected to the output voltage VCC HV, and is configured to compare the output voltage VCC HV with a third preset threshold voltage VREF3 to judge whether the output voltage VCC HV reaches an upper bound voltage.

When working, the following situations are presented.

1) When the human body resistor is not connected, the single chip microcomputer U4 detects that OA_OUT is 0V, then a terminal FB of the single chip microcomputer U4 outputs a high level signal, and the voltage boosting module U2 does not boost the output voltage VCC HV.

2) When the human body resistor is connected (i.e., the resistance is increased), the single chip microcomputer U4 detects a tiny voltage difference that is less than a first preset threshold voltage, the terminal FB outputs a low level signal, the voltage boosting module U2 continuously boosts the output voltage VCC HV, and the micro-current in the micro-current circuit is continuously increased.

3) When the current value of the micro-current in the human body resistor reaches the effective value, the single chip microcomputer U4 detects that OA_OUT is equal to the first preset threshold voltage, then FB outputs 3.3V, at the moment, U2 does not boost the output voltage any more, and the current value of the micro-current in the micro-current circuit keeps the effective value.

4) When the human body resistor is wet or the like (i.e., the resistance is reduced), the single chip microcomputer U4 detects that OA_OUT is greater than the first preset threshold voltage, and then the terminal FB outputs a high level signal. At this time, the voltage boosting module U2 does not boost the output voltage, the output voltage VCC HV slowly falls until OA_OUT is less than the first preset threshold voltage, and the circuit returns to the situation 2 to continue working.

5) When the human body resistor changes again, the circuit keeps cycling among the situation 2), the situation 3), and the situation 4) until the human body resistor leaves, and then the circuit returns to the situation 1).

6) When the output voltage VCC HV is greater than the third preset threshold voltage which is set by a user, a terminal HV_LIMIT outputs a high level signal at this time, the terminal FB outputs a high level signal at this time, and the voltage boosting module U2 no longer boosts the output voltage.

7) When the output voltage VCC HV is less than the third preset threshold voltage, the terminal HV_LIMIT outputs a low level signal.

8) When the current value of the micro-current in the micro-current circuit reaches the effective value, a terminal LED_BLUE outputs a high level signal to a control electrode of the switch tube Q1 of the indicator light module, the switch tube Q1 is controlled to be turned on, and the indicator light is turned on.

9) When the current value of the micro-current in the micro-current circuit does not reach the effective value, the terminal LED_BLUE outputs a low level signal to the control electrode of the switch tube Q1 of the indicator light module, the switch tube Q1 is controlled to be turned off, and the indicator light is turned off.

Embodiment 3

Figure 7:
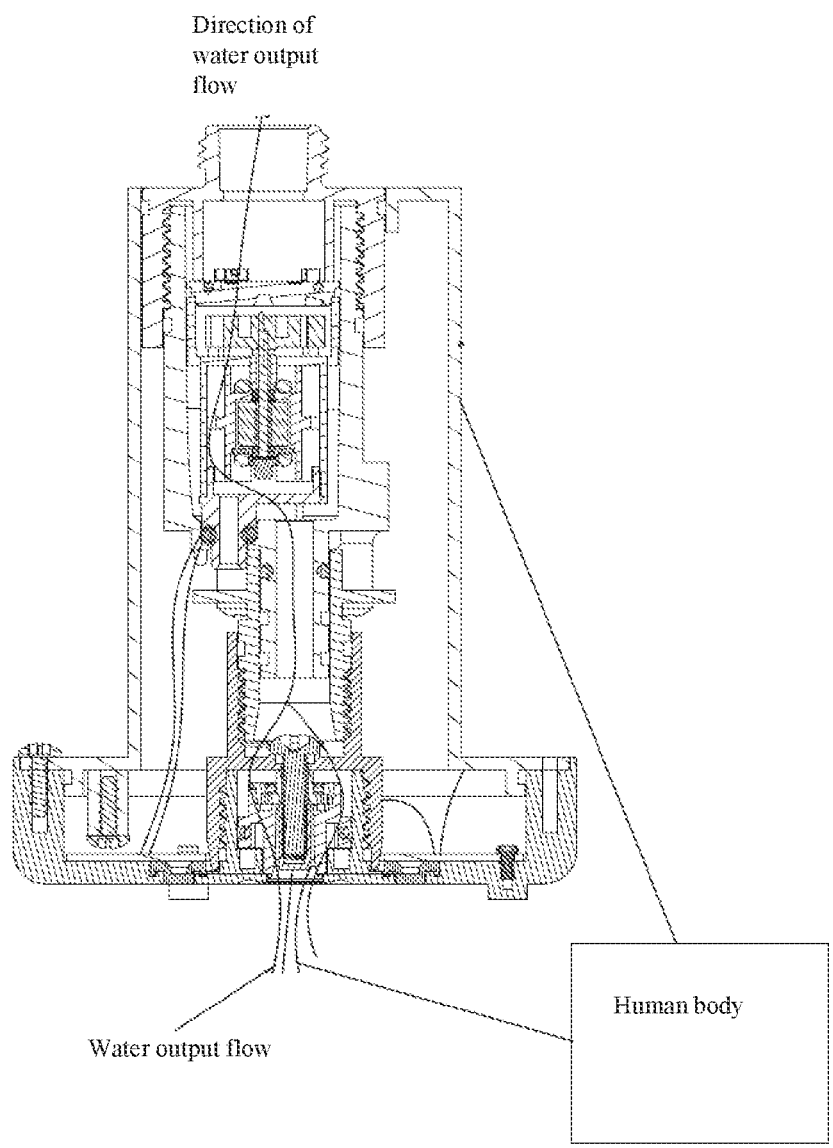
FIG. 7 illustrates a cross-sectional view of a micro-current shower head in Embodiment 3 of the present disclosure.

Referring to FIG. 7, the present disclosure also provides a micro-current shower head using the indicator light circuit configured for the micro-current. The first terminal of the external terminal J2 is connected to a water output flow of a shower head, the second terminal of the external terminal J2 is connected to the human body, and when water covers a human body surface, the first terminal and the second terminal are connected together to generate the micro-current.

The aforementioned embodiments are merely some embodiments of the present disclosure, and the scope of the disclosure is not limited thereto. Thus, it is intended that the present disclosure cover any modifications and variations of the presently presented embodiments provided they are made without departing from the appended claims and the specification of the present disclosure.

What is claimed is:

1. An indicator light circuit configured for a micro-current, comprising:
    an indicator light module,
    a logic controller,
    a sampling circuit, and
    an external terminal, wherein:
        the logic controller is configured to compare a sample voltage generated by the micro-current on the sampling circuit with a first preset threshold voltage,
        an output terminal of the logic controller is connected to the indicator light module,
        the external terminal comprises a first terminal connected to an output voltage and a second terminal connected to a sampling resistor,
        the micro-current is generated when the first terminal and the second terminal are conductively connected together through an external conductive medium, and
        when the sample voltage is greater than the first preset threshold voltage, the logic controller outputs a control signal to the indicator light module to drive an indicator light of the indicator light module to be turned on.

2. The indicator light circuit configured for the micro-current according to claim 1, further comprising:
    a rectification module, and
    a voltage boosting module, wherein:
        an input terminal of the voltage boosting module is connected to a utility power,
        an output terminal of the rectification module is connected to the input terminal of the voltage boosting module,
        the output terminal of the logic controller is connected to an output terminal of the voltage boosting module, and
        when the sample voltage is less than the first preset threshold voltage, the logic controller drives the voltage boosting module to boost the output voltage until the sample voltage is equal to or greater than the first preset threshold voltage.

3. The indicator light circuit configured for the micro-current according to claim 1, further comprising:
    a resistance access detection module, wherein:
        the resistance access detection module is configured to compare the sample voltage with a second preset threshold voltage to judge whether the first terminal and the second terminal are electrically connected together through the external conductive medium.

4. The indicator light circuit configured for the micro-current according to claim 3, wherein:
    the logic controller comprises a first comparator,
    the resistance access detection module comprises a second comparator, and
    each of an output terminal of the first comparator and an output terminal of the second comparator is connected to an OR gate.

5. The indicator light circuit configured for the micro-current according to claim 4, comprising:
    an upper bound voltage detection module, wherein:

the upper bound voltage detection module is configured to compare the output voltage with a third preset threshold voltage to judge whether the output voltage reaches an upper bound voltage.

6. The indicator light circuit configured for the micro-current according to claim 5, wherein:
the upper bound voltage detection module comprises a third comparator, and
an output terminal of the third comparator is connected to the OR gate.

7. The indicator light circuit configured for the micro-current according to claim 2, wherein:
the logic controller is a single chip microcomputer,
an input terminal of the single chip microcomputer is connected to the sample voltage, and
an output terminal of the single chip microcomputer is connected to the voltage boosting module.

8. The indicator light circuit configured for the micro-current according to claim 7, wherein:
the input terminal of the single chip microcomputer is connected to the output voltage and is configured to compare the output voltage with a third preset threshold voltage to judge whether the output voltage reaches an upper bound voltage.

9. A micro-current shower head, comprising:
a shower head body, and
an indicator light circuit configured for a micro-current disposed on the shower head body, wherein:
the indicator light circuit comprises an indicator light module disposed on the shower head body,
the indicator light circuit further comprises a logic controller and a sampling circuit,
the sampling circuit is connected to an input terminal of the logic controller,
the logic controller is operatively connected to the indicator light module,
the logic controller is configured to compare a sample voltage generated by the micro-current on the sampling circuit with a first preset threshold voltage,
an output terminal of the logic controller is connected to the indicator light module,
the indicator light circuit further comprises an external terminal,
the external terminal comprises a first terminal connected to an output voltage and a second terminal connected to a sampling resistor,
the micro-current is generated when the first terminal and the second terminal are conductively connected together through an external conductive medium, and
when the sample voltage is greater than the first preset threshold voltage, the logic controller outputs a control signal to the indicator light module to drive an indicator light of the indicator light module to be turned on.

10. The micro-current shower head according to claim 9, wherein:
the indicator light circuit further comprises a rectification module and a voltage boosting module,
an input terminal of the voltage boosting module is connected to a utility power,
an output terminal of the rectification module is connected to the input terminal of the voltage boosting module,
the output terminal of the logic controller is connected to an output terminal of the voltage boosting module, and
when the sample voltage is less than the first preset threshold voltage, the logic controller drives the voltage boosting module to boost the output voltage until the sample voltage is equal to or greater than the first preset threshold voltage.

11. The micro-current shower head according to claim 9, wherein:
the indicator light circuit further comprises a resistance access detection module, and
the resistance access detection module is configured to compare the sample voltage with a second preset threshold voltage to judge whether the first terminal and the second terminal are electrically connected together through the external conductive medium.

12. The micro-current shower head according to claim 11, wherein:
the logic controller comprises a first comparator,
the resistance access detection module comprises a second comparator, and
each of an output terminal of the first comparator and an output terminal of the second comparator is connected to an OR gate.

13. The micro-current shower head according to claim 12, wherein:
the indicator light circuit comprises an upper bound voltage detection module, and
the upper bound voltage detection module is configured to compare the output voltage with a third preset threshold voltage to judge whether the output voltage reaches an upper bound voltage.

14. The micro-current shower head according to claim 13, wherein:
the upper bound voltage detection module comprises a third comparator, and
an output terminal of the third comparator is connected to the OR gate.

15. The micro-current shower head according to claim 10, wherein:
the logic controller is a single chip microcomputer,
an input terminal of the single chip microcomputer is connected to the sample voltage, and
an output terminal of the single chip microcomputer is connected to the voltage boosting module.

16. The micro-current shower head according to claim 15, wherein:
the input terminal of the single chip microcomputer is connected to the output voltage and is configured to compare the output voltage with a third preset threshold voltage to judge whether the output voltage reaches an upper bound voltage.

* * * * *